United States Patent

Lofstedt

[11] Patent Number: 5,116,185
[45] Date of Patent: May 26, 1992

[54] VIBRATORY TUBE-TO-TUBE TRANSFER SYSTEM

[75] Inventor: Michael L. Lofstedt, Tracy, Calif.

[73] Assignee: LSI Logic Corp., Milpitas, Calif.

[21] Appl. No.: 517,048

[22] Filed: May 1, 1990

[51] Int. Cl.⁵ .............................................. B65B 35/14
[52] U.S. Cl. ................................... 414/415; 414/404; 221/200; 193/31 A
[58] Field of Search ............... 414/403, 404, 414, 415, 414/411; 193/2 B, 31 A; 198/750, 752; 221/197, 200

[56] References Cited

U.S. PATENT DOCUMENTS

| | | | |
|---|---|---|---|
| 3,552,590 | 1/1971 | Zachmeir | 414/404 |
| 3,965,648 | 6/1976 | Tedesco | 53/126 |
| 4,175,654 | 11/1979 | Lodge | 198/398 |
| 4,194,865 | 3/1980 | Bandoh | 414/403 |
| 4,222,166 | 9/1980 | Kurek et al. | 414/404 X |
| 4,592,481 | 6/1986 | Chen | 220/307 |
| 4,618,305 | 10/1986 | Cedrone et al. | 414/403 |
| 4,629,387 | 12/1986 | Stillman et al. | 414/404 |
| 4,648,773 | 3/1987 | Bieganski | 221/197 X |
| 4,651,869 | 3/1987 | Grief | 198/750 |
| 4,660,710 | 4/1987 | Swapp et al. | 198/397 |
| 4,677,937 | 7/1987 | Tee | 414/404 X |
| 4,690,302 | 9/1987 | Zebley et al. | 193/31 A |
| 4,724,965 | 2/1988 | Wilberg | 209/573 |
| 4,760,924 | 8/1988 | Sato et al. | 414/403 X |
| 4,761,106 | 8/1988 | Brown et al. | 414/403 |
| 4,763,811 | 8/1988 | Mae et al. | 414/403 X |
| 4,775,279 | 10/1988 | Linker | 414/411 |
| 4,850,785 | 7/1989 | Machado | 414/403 |
| 4,862,578 | 9/1989 | Holcomb | 414/403 X |
| 4,906,162 | 3/1990 | Long et al. | 414/403 X |
| 4,913,612 | 4/1990 | Asazuma et al. | 414/403 |
| 4,941,795 | 7/1990 | Elliot et al. | 414/403 |
| 4,952,109 | 8/1990 | Hendricks | 414/415 X |

FOREIGN PATENT DOCUMENTS

| | | | |
|---|---|---|---|
| 3539965 | 5/1987 | Fed. Rep. of Germany | 414/403 |
| 206729 | 9/1986 | Japan | 414/403 |

OTHER PUBLICATIONS

FMC Corporation, Catalog, pp. 12–13.

Primary Examiner—Frank E. Werner
Assistant Examiner—Brian K. Dinicola
Attorney, Agent, or Firm—Michael D. Rostoker; Gerald E. Linden

[57] ABSTRACT

A vibratory tube-to-tube transfer system for transferring the contents of an input tube to an output tube is disclosed. The system includes an alignment fixture having an input section for receiving an input tube loaded with ICs and an output section for receiving an empty output tube. A support plate supports the alignment fixture and a directional vibrator is affixed to the support plate for vibrating the alignment fixture and effecting the transfer of the contents of the input tube to the output tube. An equal number of input tubes and output tubes, such as eight of each, are accommodated by the transfer system.

16 Claims, 4 Drawing Sheets

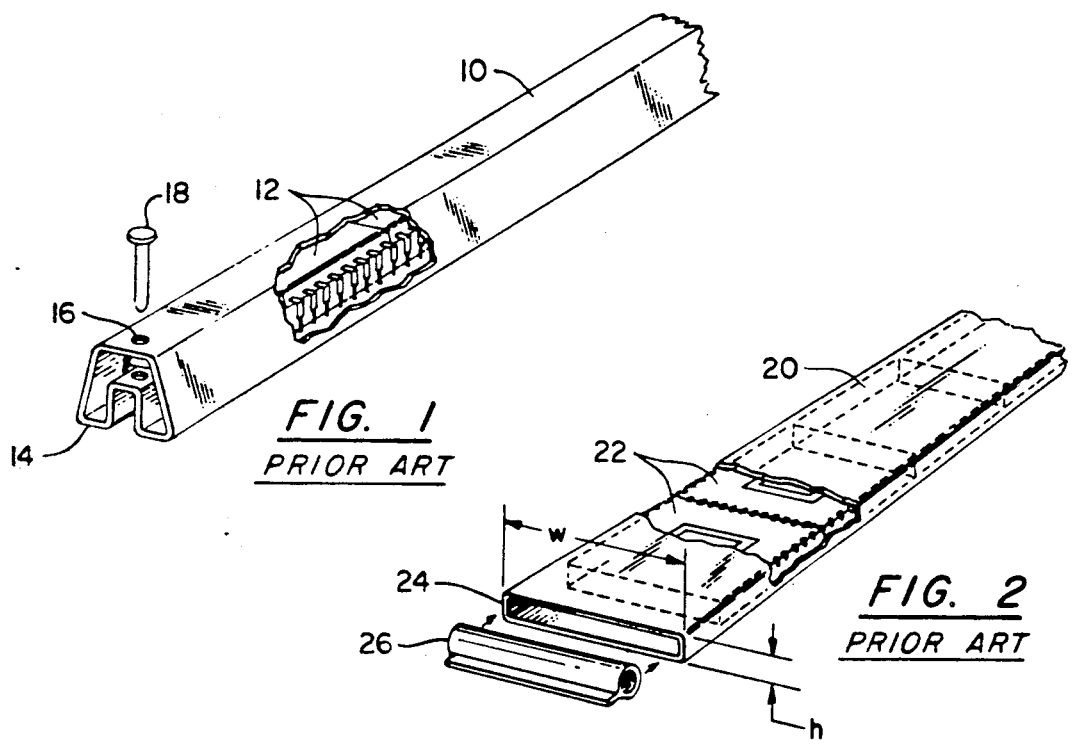
FIG. 1
PRIOR ART
FIG. 2
PRIOR ART
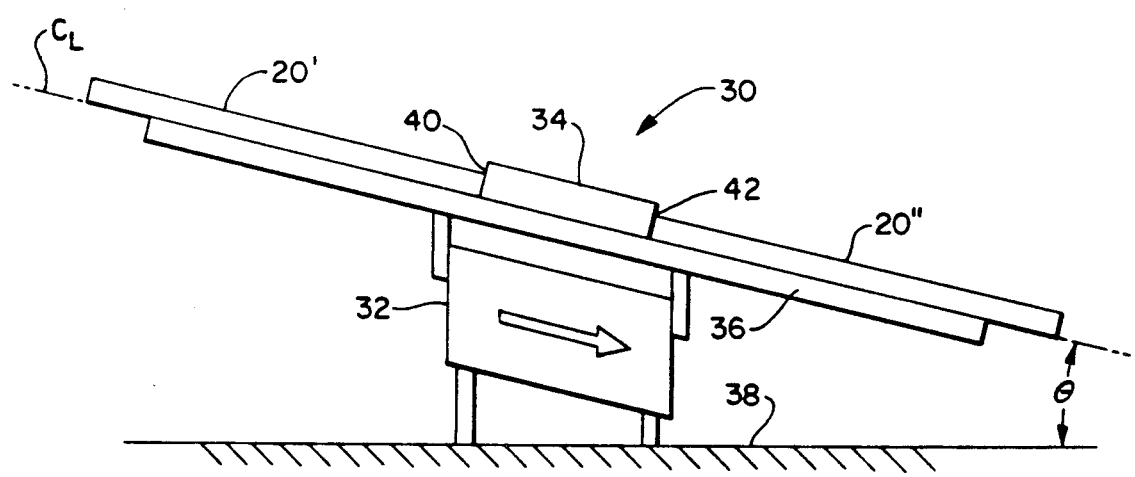
FIG. 3

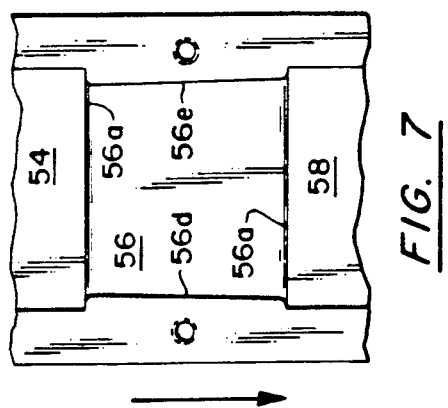
FIG. 7
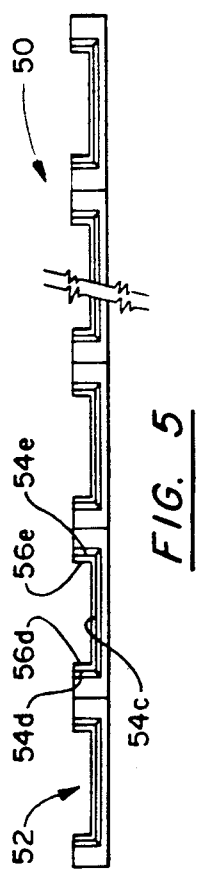
FIG. 6
FIG. 5
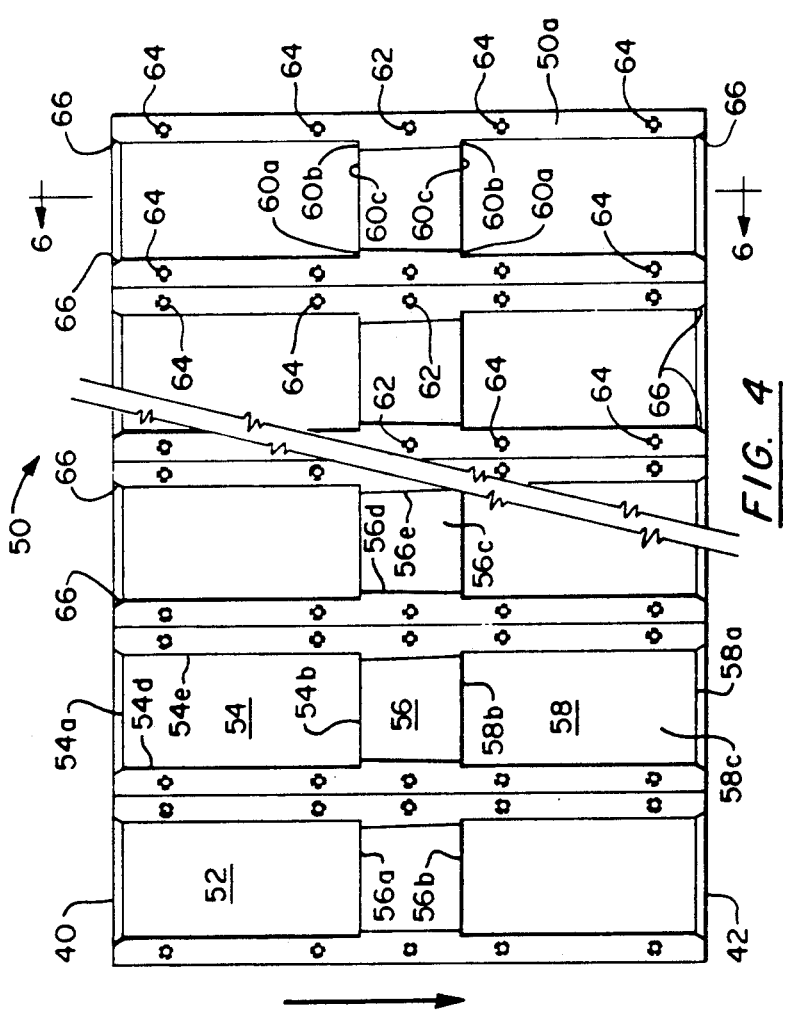
FIG. 4

VIBRATORY TUBE-TO-TUBE TRANSFER SYSTEM

TECHNICAL FIELD OF THE INVENTION

The invention relates to a system for transferring electronic components such as integrated circuits between plastic and metal tubes in which a plurality of such devices may be carried.

BACKGROUND OF THE INVENTION

Integrated circuits (ICs) are commonly disposed in carrier devices known as sleeves, tubes or magazines during the later stages of the manufacturing process and thereafter. These sleeves or tubes are generally constructed of hard, transparent plastic or similar materials. As will be evident hereinafter, it is also known to carry ICs in a metal tube.

U.S. Pat. No. 4,592,481 shows exemplary IC magazines. Figure 1 thereof shows a magazine holding a plurality of dual inline (DIP) devices. FIG. 5 therein shows a magazine holding a plurality of leadless chip carriers, such as a plastic leadless chip carrier (PLCC).

During certain late stage manufacturing operations, the integrated circuit devices may be subject to heating in an oven. Since the plastic sleeves cannot tolerate the degree of heat to which the integrated circuits are exposed, the integrated circuits have to be removed from the plastic tubes and loaded into metal tubes which can withstand the heat of the oven. After baking in the oven, the ICs are returned to plastic tubes for storage and shipping. The transfer of the integrated circuit devices, from tube-to-tube, must be accomplished with care in order to prevent any damage to the integrated circuit devices due to jarring or, in the case of leaded devices, bending of the device leads.

The transfer from tube-to-tube can be performed "manually". For example, a human operator can place one (e.g. plastic) sleeve containing a plurality of ICs end-to-end against another empty (e.g. metal) sleeve and essentially "pour" the ICs from the one sleeve to the other sleeve. Such manual handling is inconsistent with the need to reduce labor costs in the manufacture of integrated circuit devices, and is subject to problems of mishandling, and such gravity-fed systems have historically led to severe lead damage.

U.S. Pat. No. 4,724,965 discloses an automated sleeve handler for conveying components particularly integrated chips received in individual receiving portions of an input magazine to individual, separate receiving portions of an output magazine. However, the design of this sleeve handler is relatively complex and inherently causes operation and maintenance problems beyond the scope of the ordinary handler to operate.

U.S. Pat. No. 4,660,710 discloses an integrated circuit sleeve handler for use with a high-throughput integrated circuit handler. This patent is directed for example "to provide a sleeve handler which provides both full and empty sleeve handling with no manual intervening handling". Again, the design of this sleeve handler is relatively complex and inherently causes operation and maintenance problems which results in a machine beyond the scope of the ordinary handler to operate.

It is a problem underlying the present invention that there is no simple and relatively automatic technique for effecting the transfer of integrated circuit devices from a plastic tube to a metal tube, and vice-versa.

DISCLOSURE OF THE INVENTION

It is therefore an object of the present invention to provide a tube-to-tube transfer system which overcomes the problems and deficiencies discussed hereinbefore.

It is a further object of the present invention to provide a tube-to-tube transfer system which is relatively simple to operate.

It is a still further object of the present invention to provide a tube-to-tube transfer system which is relatively inexpensive to manufacture.

It is a still further object of the present invention to provide a tube-to-tube transfer system which can transfer integrated circuit devices between two sleeves, rapidly and smoothly.

It is a still further object of the present invention to provide a tube-to-tube transfer system which can handle the transfer of ICs from a number of tubes to a similar number of tubes, in one operation.

According to the invention a vibratory tube-to-tube transfer system is provided for transferring integrated circuit devices (ICs) between a number of input tubes, each containing a plurality of ICs, and an equal number of output tubes, each output tube capable of receiving the plurality of ICs from a corresponding input tube.

In the main hereinafter, the vibratory tube-to-tube transfer system is described with respect to a number, such as eight, input tubes and an equal number of output tubes, but the invention is applicable to one input tube and one output tube.

The vibratory tube-to-tube transfer system of the present invention comprises an alignment fixture having a number of input openings, each for receiving an input tube, and an equal number of output openings, each for receiving an output tube. A support plate supports the mechanical alignment fixture. A directional vibrator is affixed to the support plate for vibrating the alignment fixture in order to effect the transfer the contents (ICs) from each input tube to a corresponding output tube.

An important aspect of the present invention resides in the design of a transfer passage connecting each input opening to each output opening. The transfer passage includes an input section for receiving an end of an input tube and an output section for receiving an end of an output tube. Further, the transfer passage includes an intermediate section connecting the input section to the output section. The transfer passage is configured to provide "stops" for the input and output tubes, and to allow the integrated circuit devices to slide smoothly across the intermediate section so as to avoid "jams" and/or damage to the integrated circuit devices from jarring against each other or bending of the leads in the case of certain integrated circuit devices.

Other objects, features and advantages of the invention will become apparent in light of the following description thereof.

BRIEF DESCRIPTION OF THE DRAWINGS

FIG. 1 is a perspective view of a prior art sleeve containing integrated circuits (ICs) of the dual in-line package (DIP) type.

FIG. 2 is a perspective view of a prior art sleeve containing ICs of the plastic, leadless chip carrier (PLCC) type.

FIG. 3 is a schematic side view of the vibratory tube-to-tube transfer system of the present invention.

FIG. 4 is a top, plan view of a base section of the alignment fixture of the present invention.

FIG. 5 is an end view of the base section of FIG. 4.

FIG. 6 is a side view of the base section of FIG. 4.

FIG. 7 is a detailed, top plan view a portion of the base section of FIG. 4, showing in greater detail an intermediate section thereof.

DETAILED DESCRIPTION OF THE INVENTION

Figure 8:
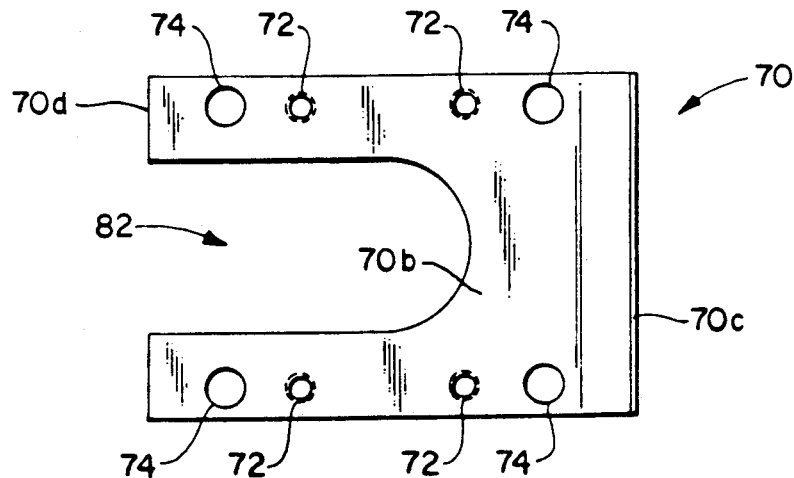
FIG. 8 is a top view of a cover plate for the alignment fixture (transfer station) of the present invention.

FIG. 1 shows an integrated circuit sleeve 10 containing a plurality (two shown) of integrated circuit devices 12 stacked end-to end therein. In this case, the integrated circuit devices are dual in-line packages (DIP). In the main hereinafter, leadless integrated circuit devices will be discussed. One end 14 of the sleeve 10 is provided with a hole 16 into which a "nail" 18 is inserted to retain the ICs within the sleeve. Other methods of closing the end of a sleeve include rubber stoppers, such as are shown in the aforementioned U.S. Pat. No. 4,592,381.

FIG. 2 shows an integrated circuit sleeve 20 containing a pulrality (two shown) of integrated circuit devices 22 stacked end-to end therein. In this case, the integrated circuit devices are plastic, leadless chip carriers (PLCCs). In the main hereinafter, sleeves for containing PLCCs will be discussed. The sleeve 20 has a rectangular cross-section, defined by a width "w" and a height "h". One end 24 of the sleeve 20 is closed with a rubber "stopper" 26 to retain the PLCCs within the sleeve. Other methods of closing the end of a sleeve include nails, as described with respect to FIG. 1.

As discussed hereinbefore, the sleeves 10, 20 can be made of a rigid plastic or of metal. Different steps and economies of scale in the integrated circuit manufacturing process dictate the use of one or the other of these materials. The present invention is applicable to both. As will become more relevant hereinafter, the plastic and metal sleeves have finite wall thicknesses, on the order of 0.025 inches.

In order to maintain reliability in ICs, it is important that they are not subject to mishandling, such as jarring or banging against each other during the manufacturing process. In the case of a DIP, as illustrated in FIG. 1, it is important that the leads do not become bent or twisted during handling. In the case of any IC configuration, it is important that the ICs do not bang against each other, end-to-end, while in the sleeves. The present invention is specifically directed to handling the ICs in a relatively rapid manner without jarring, banging or affecting lead placement.

FIGS. 3-10 show the vibratory the tube-to-tube transfer system 30 of the present invention, as applicable to sleeves 20 for carrying PLCCs. However, the invention is equally applicable to handling the transfer of DIPs from sleeve-to-sleeve, as well as a variety of other IC/sleeve configurations.

As shown in FIG. 3, the main components of the tube-to-tube transfer system 30 include a directional vibrator 32, an alignment fixture 34, a support plate 36, and a support table 38. The alignment fixture 34 is also referred to as a transfer station or jig. The reference numeral 20' refers to input tubes containing a plurality of ICs, and the reference numeral 20" refers to an output tube for receiving the plurality of ICs.

In operation, a plurality, generally up to eight, of input tubes 20' are inserted endwise into input openings 40 of the alignment fixture 34. The input tubes 20' are filled with a plurality of ICs, such as the PLCCs 22 discussed hereinbefore. A corresponding number of empty output tubes 20" are inserted endwise into the output opening 42 of the alignment fixture 34. The empty output tubes 20" are generally of the same size as the input tubes 20', but whereas the input tubes may be made of plastic, the output tubes may be made of metal.

It is evident that the input and output tubes are inclined, with the input tubes elevated higher than the output tubes. However, as discussed hereinafter, the inclination is insufficient for gravity alone to cause the ICs to slide from the input tubes to the output tubes.

When the directional vibrator 32 is activated, it imparts a unidirectional motion to the support plate 36, as well as to the input and output tubes. This motion is indicated by the arrow, and is sufficient to cause the ICs to flow or slide from the input tubes 20', across the alignment fixture 34, into the output tubes 20" smoothly and without jarring against each other in order that the ICs are not damaged. As mentioned hereinbefore, the input tubes 20' are disposed above (at a higher elevation than) the output tubes and the vibrator 32 assists in the movement of the ICs from the full input tubes 20' to the empty output tubes 20".

As is evident from FIG. 3, the input and output tubes are in-line with each other, end-to-end, and their inward ends are spaced-apart by the transfer fixture 34. The input and output tubes are parallel to the support plate 36. A longitudinal centerline $C_L$ extending along the support plate 36 preferably forms an angle between about 15 and 25 degrees with the support table 38, and an angle of about 20 degrees has been found to yield optimal performance. This angle is generally selected as being a degree or two less (more horizontal) than an angle at which the ICs would slide by themselves, naturally, without the assistance of the directional vibrator. At the selected angle, which may be empirically determined, the ICs are "ready" to flow smoothly from the input tubes to the output tubes with the assistance of the directional vibrator 32.

The tube-to-tube transfer system of the present invention is suitably used to transfer ICs from plastic input tubes to metal output tubes for treatment of the ICs in an oven, the temperature of which would be injurious to plastic tubes. Since the plastic tubes are generally unable to withstand the heat of the oven, the metal tubes are preferably used. After the ICs have been processed in the oven, they are preferably tranferred back to (less expensive) plastic tubes for shipment to a customer. This transfer from metal tubes to plastic tubes is accomplished in the same manner as described above, except that the input tubes (20') would be the full metal tubes and the output tubes (20") would be empty plastic tubes. The transfer of the ICs from the metal tubes to the plastic tubes may occur while the ICs are still warm. Therefore, it is important that the transfer from the metal tubes to the plastic tubes be made quickly to prevent prolonged exposure of the ICs devices to the atmosphere, where in the presence of air they can absorb undesirable ambient moisture.

Hence, it is seen that the tube-to-tube transfer system can also be operated with the full metal output tubes loaded in the input end 40 of the alignment fixture 34 and the empty input plastic tubes located in the output end 42 of the alignment fixture.

The support plate 36 is of adequate length and width to support the input tubes 20' and the output tubess 20" when they loaded into the alignment fixture 34. The support plate 36 is attached atop the directional vibrator 32 in a conventional manner. An example of a suitable directional vibrator is a Model BF-2 drive unit manufactured by the FMC Corporation, Material Handling Equipment Division of Homer City, Pa. This vibrator provides directional vibrating conveying movement to the support plate 36. It is, however, within the scope of the present invention to use any effective vibrating device capable of handling the weight of the plate 36, the alignment fixture 34 and the tubes 20' and 20".

FIGS. 4-11 show in greater detail the construction of the alignment fixture 34.

FIGS. 4, 5, 6 and 7 show a baseplate 50 of the alignment fixture 34. In FIGS. 4, 5 and 6 are shown orthogonal views of an alignment fixture that can accomodate a number, such as seven or eight, input tubes and an equal number of corresponding output tubes.

The baseplate 50 includes a number (eight) of transfer passages 52 extending between the input openings 40 and the output openings 42. Each of the transfer passages 52 includes, in order, an input section 54, an intermediate section 56 and an output section 58. The outward end 54a of the input section 54 forms the input opening 40, the inward end 54b of the input section is contiguous with an input end 56a of the intermediate section 56, the outward end 58a of the output section forms the output opening 42, and the inward end 58b of the output section 58 is contiguous with an output end 56b of the intermediate section 56.

The input section 54 has a base surface 54c of a width sufficient to receive the widthwise (outside) dimension (w) of an input tube (e.g., a PLCC tube 20), and has two opposing, parallel walls 54d and 54e of a height, h', slightly less than the heightwise dimension (h) of the input tube.

The output section 58 has a base surface 58c of a width sufficient to receive the widthwise dimension (w) of an output tube (e.g., a PLCC tube 20), and has two opposing, parallel walls 58d and 58e of a height, h', slightly less than the heightwise dimension (h) of the output tube.

The intermediate section 56 has an input end 56a and an output end 56b, and has a base surface 56c of width w' slightly less than "w", as described hereinafter. The base surface 56c of the intermediate section 56 is elevated slightly above the coplanar base surfaces 54c, 58c of the input and output sections 54, 58, respectively. Further, the intermediate section has two side walls 56d and 56e of a height greater than that of an IC passing therethrough. (The height of the IC is inherently less than the outside height dimension of the tube carrying it.)

The base plate 50 has a flat top surface 50a, described in greater detail hereinafter. Each of the input, intermediate and output sections, as formed in the base plate 50 are open at their top surface to be closed by a cover plate 70, described hereinafter. The outer ends 54a, 58a of the input and output sections, respectively, form three of the four sides of an input and output opening 40, 42, respectively, for receiving an end of an input and output tube, respectively.

At their outer ends 54a, 54b, respectively, the side walls of the input and output sections are bevelled (see reference numeral 66) to a larger dimension to allow for easy insertion of the end of a tube. As an input or output tube is inserted into the input and output sections 54, 58, it is guided along the base surface 54c, 58c thereof between the two side walls thereof, until the end of the tube encounters "stops" 60a, 60b, 60c formed at the input and output end 56a, 56b of the intermediate section 56. The "stops" result from the aforementioned slightly thicker base surface 56c of the intermediate section 56 and the narrower span between the walls 56d, 56e thereof. This results in a decreased cross section of the intermediate section 56 as compared with the input and output sections, and are dimensioned to be no greater than the wall thickness of an input or output tube. In this manner, the stops 60a, 60b, 60c limit the extent to which an input or output tube can be inserted in the alignment fixture 34, and they further provide a tactile indication that the inward (inserted) ends of the tubes are firmly positioned directly against the intermediate section of the transfer station. It is further evident that the diminished cross section of the intermediate section 56 corresponds to and will be in-line with the inner surfaces of the input and output tubes so that ICs sliding thereacross will encounter no significant impediment as they slide from an input tube, across the intermediate section, to the output tube.

As mentioned, three stops are formed by the smaller cross-section of the intermediate section, corresponding to the inner dimension of the tubes, as compared to the input and output sections which have cross-sections corresponding to the outer dimensions of the tubes. However, this smaller cross-section is still sufficiently large to allow the free passage of ICs thereby. Preferably, the stops are dimensioned slightly less than the thickness of the walls of the input and output tubes, which are nominally on the order of 0.025 inches.

Referring to FIG. 7, the input-end and output-end stops 60a, 60b, 60c are disposed at respective intersections or junctions of the input and output sections with the intermediate section. Moreover, as best viewed in FIGS. 4 and 5, the input and output stops each are formed by three surfaces, two side surfaces and a bottom surface, which engage three corresponding walls and bottom side of the tube and provide additional security that the tube will be secured in the desired position. It can be appreciated that the definite positioning of the tubes next to the intermediate transfer section is very important to ensure the smooth sliding movement of ICs from the input tube 20' into the transfer (intermediate) section 56 and thence into the output tube 20".

An important feature of the input and output stops are that they have a depth which is substantially equal to, but not greater than the wall thickness of the input and output tubes. This wall thickness causes the bottom inside surface of the tubes to align almost perfectly with the bottom surface 54c of the intermediate section 54 so that ICs will slide through the alignment fixture smoothly and without jamming. As mentioned hereinbefore, the height of the intermediate section, from its base surface 54c to the top surface 50a of the base section 50, is sufficient to allow for the free passage of an IC therethrough.

As shown in FIG. 4, there is a slight outwardly expanding taper of the walls 56d and 56e of the intermediate section 56 from the input end 56a thereof to the output end 56b thereof. The result is that the cross-section at the input end 56a is slightly smaller than the cross-section at the output end 56b.

As shown in FIG. 7, the walls 56d and 56e taper inwardly from both ends 56a, 56b of the intermediate section to a midpoint thereof. Preferably, this taper is on the order of two degrees, and the cross-section of the intermediate section 56 is still sufficient to allow an IC to slide freely therethrough.

With either taper, the effect is to enable the ICs devices to slide smoothly across the intermediate section 56. Another subtle aspect of the design is the slightly rounded (four) corners of the walls 56d and 56e near their respective intersections with the input and output sections 54 and 58.

Figure 9:
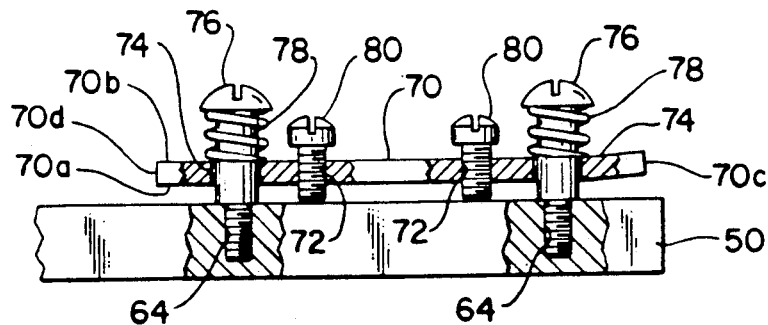
FIG. 9 is a detailed side view of a portion of the cover plate of FIG. 8.

Turning now to FIGS. 8 and 9 there is shown a cover plate 70 for enclosing each of the input and output sections 54 and 58 of the base plate 50, thereby "completing" the formation of the input and output openings 40 and 42. The cover plate 70 has an inner surface 70a directed towards the base plate 50, an outer surface 70b directed away therefrom, an outward edge 70c directed away from the intermediate section 56 and an inward edge 70d directed towards the intermediate section 56. The cover plate 70 is mounted resiliently to the top surface 50a of the base plate 50, as follows.

The top surface 50a of the base plate 50 is provided with four threaded holes 64 for each of the input and output sections 54 and 58, two of these holes located near the outward ends thereof and two of these holes located near the inward ends thereof. The cover plate 70 is provided with four correspondingly located holes 74.

A bolt 76, preferably a shoulder bolt, passes through the cover plate from the outside surface thereof and is threaded into the hole 64. This is for all four holes 64 (and all four holes 74). A spring 78 is disposed between the head of the bolt 76 and the outside surface of the cover plate, and urges the cover plate at all times downward onto a tube inserted into the input (or output) section.

An important aspect of the present invention is that the resilient mounting of the cover plate 70 enables the input and output tubes to be firmly held in place in their respective input/output sections 54/58. The resilient mounting of the cover plate further enables the system to accommodate slightly different sizes of tubes (metal and plastic tubes may differ in cross section by one or two thousandths of an inch) and allow for dimensional variations from tube-to-tube.

The cover plate 70 is further provided with a threaded hole 72. In order that the proper heightwise dimension is maintained between the base surfaces 54c,58c of the input and output sections 54 and 58 and the inner surface 70a of the cover plate, a set screw 80 is provided to establish a minimum distance that the spring 78 can "collapse" the cover plate 70. The set screw 80 threads into the threaded hole 72, and "bottoms out" against the top surface 50a of the transfer station 50. In this manner the set screw 80 limits the downward movement of the cover plate 70 towards the base surfaces 54c,58c of the input and output sections.

When a tube is not inserted into the transfer fixture 36, the set screw maintains the distance between the cover plate 70 and the base surface to a desired height, which is slightly less than the height of the tube to allow for a snug, yet easy insertrion thereof into the respective input or output opening 40, 42. During the insertion of the tube into the input/output opening, the cover plate moves upward against the bias of the spring 78. Once the tube is fully inserted between the plate element and the base surface, it is held snugly by virtue of the spring-biased cover plate 70.

As best viewed in FIG. 9, the outward end 70c of the cover plate 70 projects (is curved) slightly upward, forming a slightly oversize opening to allow for easy insertion of the tubes. The tubes can then be inserted into the fixture towards the intermediate section, until further insertion is limited by the stops (60a, 60b, 60c).

A U-shaped cutout 82 is provided in the cover plate 70, extending inwardly from the inner end 70d thereof. The cutout 82 conveniently provides an opening into which an operator can place his finger to free and move an IC which has become stuck or jammed in the tube-to-tube transfer process. This may require in some cases partially "backing out" the tube having such a "jammed" IC from its respective input (typically) section.

Figure 10:
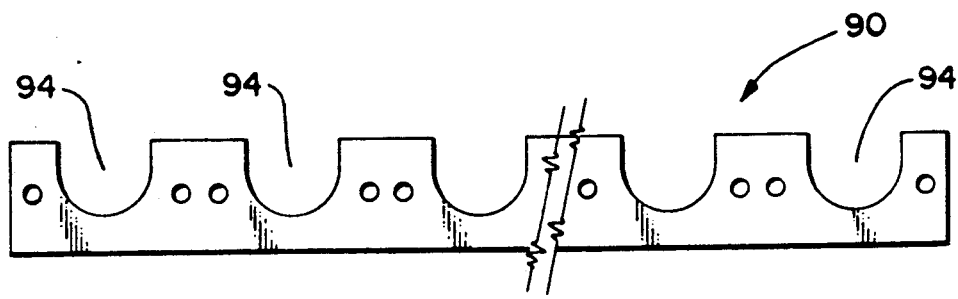
FIG. 10 is a top view of the another cover plate for the alignment fixture of the present invention.
Figure 11:
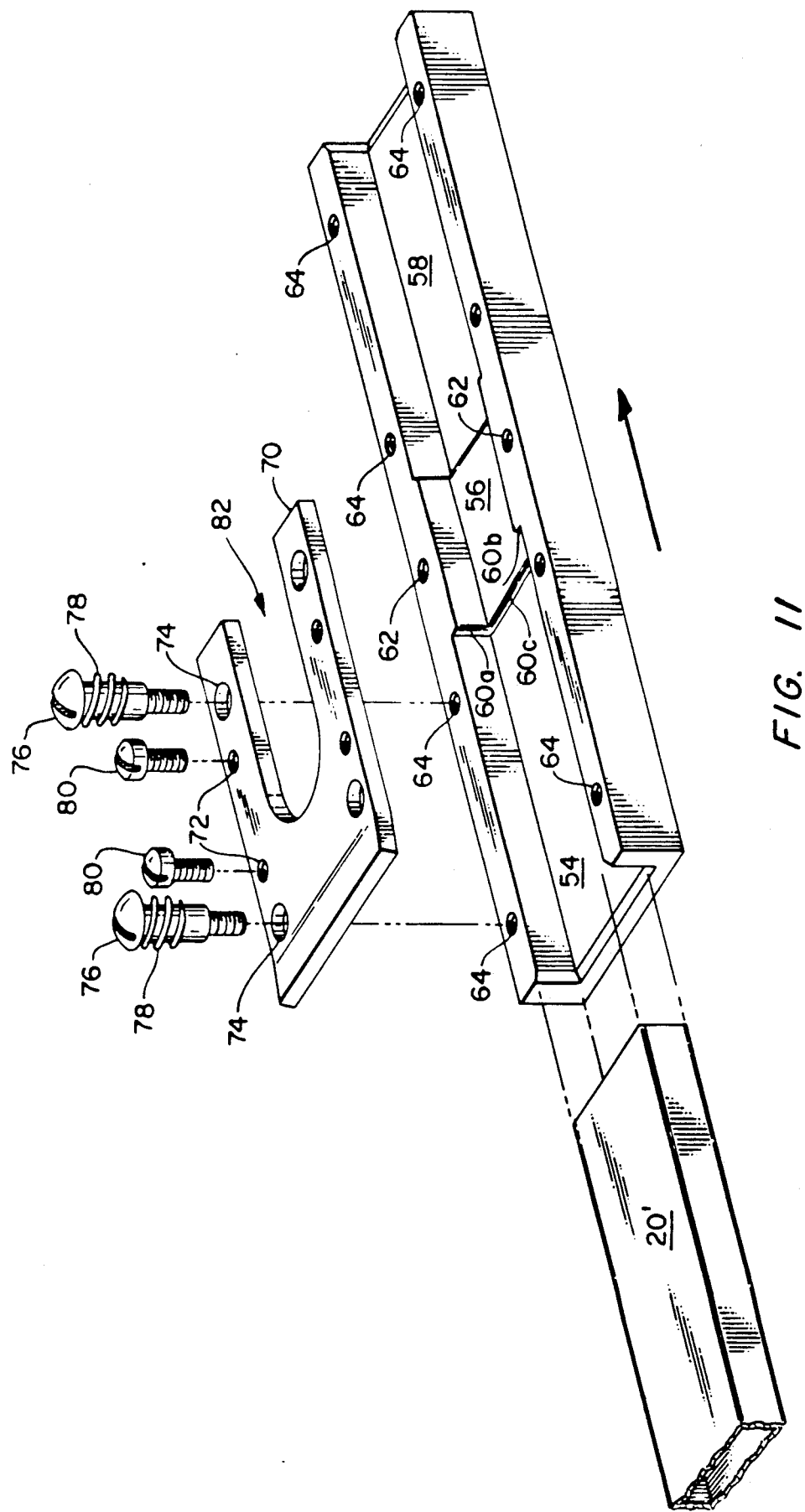
FIG. 11 is an exploded perspective view of the alignment station of the present invention.

FIG. 10 shows a cover plate 90, which is optionally provided for covering the intermediate transfer section 56. Unthreaded holes 92 in the cover plate 90 align with threaded holes 62 in the top surface 50a of the base plate 50. Again, U-shaped cutouts are provided at positions corresponding to the location of each intermediate transfer section 56 to facilitate manually assisting the transfer of ICs across the intermediate transfer section 56. Preferably, the U-shaped cutouts 94 are oriented towards and aligned with the U-shaped cutouts 82 of the input section 54 cover plate 70 so that a large opening is formed by the two U-shaped cutouts.

It is apparent that there has been provided in accordance with this invention a tube-to-tube transfer system for transferring devices such as ICs which satisfies the objects, set forth hereinbefore. While the invention has been described with respect to a particular embodiment thereof, it is evident that many alternatives, modifications and variations will be apparent to those skilled in the art in light of the foregoing description. Accordingly, it is intended to embrace all such alternatives, modifications, and variations as fall within the spirit and broad scope of the appended claims.

What is claimed is:

1. A vibratory tube-to-tube transfer system for transferring integrated circuit devices from an input tube to an output tube, comprising:

an alignment fixture having an input section for receiving and partially enclosing an end of an input tube containing integrated circuit devices, an output section in collinear alignment with the input section for receiving and partially enclosing an end of an output tube capable of receiving integrated circuit devices from an input tube, and a linear transfer section having a first end adjacent to and collinear with said input section and a second end adjacent to and collinear with said output section; wherein the input section holds an input tube in longitudinal, end-to-end, spaced-apart, collinear alignment with an output tube held in said output section;

support means for supporting said alignment fixture;

vibrator means affixed to said support means for directionally vibrating said alignment fixture to transfer integrated circuits from an input tube through said linear transfer section and into an output tube;
- a first cover plate including means for resiliently closing the input section, said means for resiliently closing the input section including first spring means for limiting the maximum vertical distance of said first cover plate above a top surface of said input section and for biassing said first cover plate against an input tube; and
- a second cover plate including means for resiliently closing the output section, said means for resiliently closing the output section including second spring means for limiting the maximum vertical distance of said second cover plate above a top surface of said output section and for biassing said second cover plate against an output tube.

2. The vibratory tube-to-tube transfer system of claim 1, wherein outward ends of the first and second cover plates are flared to allow for easy insertion of an input tube into the input section and an output tube into the output section.

3. The vibratory tube-to-tube transfer system of claim 2, further comprising:
an opening on an inward end of the first cover plate for allowing an operator to insert a finger into the input section and assist in the transfer of integrated circuit devices from the input section to the output section.

4. The vibratory tube-to-tube transfer system of claim 1, further comprising:
- a longitudinal transfer passage extending along said linear transfer section and connecting said input section to said output section; and
- a third cover plate closing said linear transfer section.

5. The vibratory tube-to-tube transfer system of claim 1 wherein said alignment fixture includes a longitudinal transfer passage extending along said linear transfer section.

6. The vibratory tube-to-tube transfer system of claim 5 wherein said transfer passage includes two side walls and a base surface which extend the length of the transfer passage.

7. The vibratory tube-to-tube transfer system of claim 5, wherein said linear transfer section has a smaller cross section than the input section, and said linear transfer section has a smaller cross section than the output section, said linear transfer section being tapered between the input section and the output section to assist in the transfer of integrated circuit devices from an input tube to an output tube.

8. The vibratory tube-to-tube transfer system of claim 7, wherein the walls of said longitudinal transfer passage are tapered inwardly from both the input and output sections to a midpoint of the intermediate transfer section.

9. The vibratory tube-to-tube transfer system of claim 7, further comprising:
at least one first input stop member formed at an intersection of the input section and the linear transfer section for providing a stop for an input tube, the thickness of said at least one first stop member being substantially the same as the thickness of an input tube wall to enable integrated circuit devices from an input tube to slide freely from an input tube onto the base surface of said transfer passage.

10. The vibratory tube-to-tube transfer system of claim 9, further comprising:
at least one second output stop member formed at an intersection of the output section and the linear transfer section for providing a stop for an output tube, the thickness of said at least one second stop member being substantially the same as the thickness of an output tube wall to enable integrated circuit devices from an input tube to slide freely from the linear transfer section to an output tube.

11. The vibratory tube-to-tube transfer system of claim 1 wherein the integrated circuit devices are plastic leadless chip carriers.

12. The vibratory tube-to-tube transfer system of claim 1 wherein the integrated circuit devices are dual-in-line packages.

13. The vibratory tube-to-tube transfer system of claim 1, wherein the alignment fixture and support means are oriented at an angle, with respect to horizontal, such that an input tube is inclined above an output tube.

14. The vibratory tube-to-tube transfer system of claim 13, wherein the angle is approximately 1-2 degrees less than an angle at which the integrated circuit devices would slide by gravity from an input tube to an output tube.

15. The vibratory tube-to-tube transfer system of claim 13, wherein the angle is between 15 and 25 degrees.

16. The vibratory tube-to-tube transfer system of claim 15, wherein the angle is approximately 20 degrees.

* * * * *